US008110042B2

(12) United States Patent
Narushima et al.

(10) Patent No.: US 8,110,042 B2
(45) Date of Patent: Feb. 7, 2012

(54) METHOD FOR MANUFACTURING SINGLE CRYSTAL

(75) Inventors: Yasuhito Narushima, Omura (JP); Shinichi Kawazoe, Omura (JP); Fukuo Ogawa, Omura (JP); Tsuneaki Tomonaga, Omura (JP); Yasuyuki Ohta, Omura (JP); Toshimichi Kubota, Omura (JP); Shinsuke Nishihara, Omura (JP)

(73) Assignee: Sumco Techxiv Corporation, Omura-shi (JP)

( * ) Notice: Subject to any disclaimer, the term of this patent is extended or adjusted under 35 U.S.C. 154(b) by 338 days.

(21) Appl. No.: 12/515,730

(22) PCT Filed: May 7, 2008

(86) PCT No.: PCT/JP2008/058483
§ 371 (c)(1),
(2), (4) Date: May 20, 2009

(87) PCT Pub. No.: WO2008/142993
PCT Pub. Date: Nov. 27, 2008

(65) Prior Publication Data
US 2010/0050931 A1   Mar. 4, 2010

(30) Foreign Application Priority Data

May 10, 2007   (JP) .................... 2007-125848

(51) Int. Cl.
*C30B 15/20* (2006.01)
*C30B 15/02* (2006.01)
*C30B 15/04* (2006.01)

(52) U.S. Cl. ............... 117/14; 117/19; 117/20; 117/21; 117/208; 117/218; 117/932; 423/348; 423/349

(58) Field of Classification Search .............. 117/14, 117/19, 20, 208, 218, 932; 423/348, 349
See application file for complete search history.

(56) References Cited

U.S. PATENT DOCUMENTS

| 5,429,067 A | * | 7/1995 | Tatsumi et al. | 117/13 |
| 5,477,805 A | | 12/1995 | Izunome et al. | |
| 5,524,574 A | * | 6/1996 | Huang et al. | 117/20 |
| 5,904,768 A | * | 5/1999 | Holder | 117/20 |

FOREIGN PATENT DOCUMENTS

JP   03-159986 A   7/1991
(Continued)

OTHER PUBLICATIONS

International Preliminary Report on Patentability in English, dated Nov. 24, 2009, issued in a counterpart International Application No. PCT/JP2008/058483.
Xinming Huang, et al., "Effect of Background Gas Pressure on Evaporation of Oxides from Sb-Doped Si Melt," Jpn. J. Appl. Phys. vol. 33 (1994), pp. L902-L904.

(Continued)

*Primary Examiner* — Stanley Silverman
*Assistant Examiner* — Diana J Liao
(74) *Attorney, Agent, or Firm* — Holtz, Holtz, Goodman & Chick, PC

(57) ABSTRACT

Using a pulling-up apparatus, an oxygen concentration of the monocrystal at a predetermined position in a pulling-up direction is controlled based on a relationship in which the oxygen concentration of the monocrystal is decreased as a flow rate of the inactive gas at a position directly above a free surface of the dopant-added melt is increased when the monocrystal is manufactured with a gas flow volume in the chamber being in the range of 40 L/min to 400 L/min and an inner pressure in the chamber being in the range of 5332 Pa to 79980 Pa. Based on the relationship, oxygen concentration is elevated to manufacture the monocrystal having a desirable oxygen concentration. Because the oxygen concentration is controlled under a condition corresponding to a condition where the gas flow rate is rather slow, the difference between a desirable oxygen concentration profile of the monocrystal and an actual oxygen concentration profile is reduced.

1 Claim, 8 Drawing Sheets

FOREIGN PATENT DOCUMENTS

| | | |
|---|---|---|
| JP | 05-070279 A | 3/1993 |
| JP | 7-232994 A | 9/1995 |
| JP | 09-227275 A | 9/1997 |
| JP | 10-182289 A | 7/1998 |
| JP | 2000-233994 A | 8/2000 |
| JP | 2004-149411 A | 5/2004 |
| WO | WO 01/63027 A1 | 8/2001 |

OTHER PUBLICATIONS

English Language International Search Report dated Aug. 12, 2008 issued in parent Appln. No. PCT/JP2008/058483.
Related U.S. Appl. No. 12/515,725, filed May 20, 2009.

* cited by examiner

METHOD FOR MANUFACTURING SINGLE CRYSTAL

This application is a U.S. National Phase Application under 35 USC 371 of International Application PCT/JP2008/058483 filed May 7, 2008.

TECHNICAL FIELD

The present invention relates to a manufacturing method of a monocrystal.

BACKGROUND ART

Conventionally, an arrangement in which an oxygen concentration of a monocrystal is controlled is known (see, e.g., patent documents 1 and 2).

According to the patent document 1, when a silicon rod is manufactured using a crystal pulling-up apparatus, as a length of the silicon rod increases, a gas pressure of atmosphere over the silicon melt material is increased to limit evaporation of a silicon oxide material, thereby compensating decrease of oxygen contained in the melt material.

According to the patent document 2, when a silicon monocrystal is manufactured using a silicon monocrystal pulling-up apparatus, a flow rate of inactive gas flowing between a gas guide and a silicon melt is adjusted so that the flow rate is gradually accelerated from the start of the pulling-up toward the end of the pulling-up.

Patent Document: JP-A-10-182289
Patent Document: JP-A-5-70279

DISCLOSURE OF THE INVENTION

Problems to be Solved by the Invention

However, according to the patent document 1, it may be possible only to merely elevate the oxygen concentration of the monocrystal, and it may not be possible to manufacture a monocrystal having a desirable oxygen concentration.

Also, according to the patent document 2, oxygen that decreases while the crystal is pulled is increased, but such technique is useless when it is necessary to increase the crystal oxygen concentration in the early stage of the pulling-up. Accordingly, an oxygen concentration profile along a longitudinal direction of the crystal may not be evened out.

An object of the invention is to provide a manufacturing method of a monocrystal capable of appropriately controlling an oxygen concentration of the monocrystal.

Means for Solving the Problems

A method for manufacturing a monocrystal according to an aspect of the invention includes: using a pulling-up apparatus including: a chamber having, at an upper portion thereof, an intake through which an inactive gas is introduced; a crucible disposed in the chamber and adapted to contain a dopant-added melt generated by adding a volatile dopant to a semiconductor melt; and a pulling-up portion that pulls up a seed crystal after the seed crystal is contacted with the dopant-added melt for manufacture of the monocrystal; and controlling an oxygen concentration of the monocrystal at a predetermined position in a pulling-up direction based on a relationship in which the oxygen concentration of the monocrystal is decreased as a flow rate of the inactive gas directly above a free surface of the dopant-added melt in the crucible is increased when the monocrystal is manufactured with a flow volume of the inactive gas introduced in the chamber being in the range of 40 L/min to 400 L/min and a pressure in the chamber being in the range of 5332 Pa to 79980 Pa.

Another method of manufacturing a monocrystal according to another aspect of the invention includes: using a pulling-up apparatus including: a chamber having, at an upper portion thereof, an intake through which an inactive gas is introduced; a crucible disposed in the chamber and adapted to contain a dopant-added melt generated by adding a volatile dopant to a semiconductor melt; a flow regulating member that is shaped in a cylinder or shaped in a reversed truncated cone having openings at upper and lower ends and is disposed at an upper side of the crucible; and a pulling-up portion that, for manufacture of the monocrystal, pulls up a seed crystal so that the seed crystal passes through an inside of the flow regulating member after the seed crystal is contacted with the dopant-added melt; and controlling an oxygen concentration of the monocrystal at a predetermined position in a pulling-up direction based on a relationship in which the oxygen concentration of the monocrystal is decreased as a flow rate of the inactive gas directly above a free surface of the dopant-added melt in the crucible is increased when the monocrystal is manufactured with a flow volume of the inactive gas introduced in the chamber being in the range of 40 L/min to 400 L/min and a pressure in the chamber being in the range of 5332 Pa to 79980 Pa.

With the aspects of the invention, in a method of for manufacturing a monocrystal by using a pulling-up apparatus with a flow regulating member or a pulling-up apparatus without a flow regulating member and pulling up a seed crystal after contacting the seed crystal with a dopant-added melt, an oxygen concentration of the monocrystal at a predetermined position in a pulling-up direction is controlled based on a relationship in which the oxygen concentration of the monocrystal is decreased as a flow rate of the inactive gas directly above a free surface of the dopant-added melt in the crucible (hereinafter abbreviated as the surface top position) is increased when the monocrystal is manufactured with a flow volume of the inactive gas in the chamber being in the range of 40 L/min to 400 L/min and a pressure in the chamber being in the range of 5332 Pa to 79980 Pa.

After a dedicated study, the inventor(s) has(have) made findings as follows.

When a monocrystal is manufactured by contacting a seed crystal with a dopant-added melt generated by adding a volatile dopant to a semiconductor melt, under a condition in which a flow volume of the inactive gas introduced in the chamber (hereinafter referred to as the gas flow volume) is set to be in the range of 40 L/min to 400 L/min and a pressure within the chamber at the time of the pulling-up from the dopant-added melt (hereinafter referred to as inner pressure) is set to be in the range of 5332 Pa to 79980 Pa, in other words, under a condition in which a flow rate of the inactive gas at a position directly above the melt surface is so low as to be equal to or lower than 1 m/sec, the oxygen concentration and the flow rate of the inactive gas at a position directly over the melt surface were found to be on such a relationship that the oxygen concentration decreases as the flow rate of the inactive gas increases. Under a condition where the gas flow rate is so low as to be equal to or lower than 1 m/sec, evaporation of semiconductor oxygen evaporant ($Si_xO_y$) from the melt is increased in accordance with the rise in the gas flow rate, thereby decreasing oxygen absorbed in the crystal. On the other hand, when the gas flow rate is equal to or greater than 1 m/sec, the flow of the gas influences the melt convection in the vicinity of the free surface, so that the amount of oxygen absorbed in the crystal increases contrary to the above. When the volatile dopant is added to the monocrystal and the monocrystal is pulled, an excessively-high flow rate increases evaporation so that a resistance rate becomes less controllable. Thus, oxygen was controlled at a condition of a low flow rate of 1 m/sec or lower.

Specifically, a monocrystal for which the gas flow volume and the inner pressure were changed within the above-mentioned range was manufactured, and oxygen concentrations of multiple portions in the pulling-up direction of the monocrystal were measured. In addition, for each predetermined pulling-up position that is a predetermined position in the pulling-up direction of the monocrystal, a relationship between: the flow rate of the inactive gas calculated by the following formula (1) (hereinafter referred to as the gas flow rate calculating formula (1)) based on the gas flow volume and the inner pressure; and the oxygen concentration was examined. As a result, it was found that, as shown in FIGS. 1 and 2, the oxygen concentration of the monocrystal decreases as the flow rate of the inactive gas at the position directly above the fluid surface increases.

Note that, in the gas flow rate calculating formula (1), R indicates a flow rate (m/sec) of the inactive gas at a position directly above the melt surface, V indicates the gas flow volume (L/min), D indicates an inner diameter (m) of the flow regulating member, G indicates a distance (m) between a lower end of the flow regulating member and a surface of the dopant-added melt, and P indicates the inner pressure (Pa).

FIG. 1 shows a relationship between the inactive gas flow rate and the oxygen concentration at a position 200 mm distant from the end in the pulling-up direction of the straight body of the monocrystal. FIG. 2 shows a relationship between the inactive gas flow rate and the oxygen concentration at a position 500 mm distant from the end in the pulling-up direction of the straight cylindrical portion of the monocrystal.

$$R = \frac{V \times 10^{-3}}{\pi \times D \times G} \times \frac{760 \times 133.3}{P} \times \frac{1}{60} \quad (1)$$

Accordingly, by controlling the oxygen concentration based on the above-mentioned relationship, elevation of the oxygen concentration of the monocrystal can be suitably controlled, and a monocrystal having a desirable oxygen concentration can be manufactured.

In addition, because the oxygen concentration is controlled based on the above-mentioned relationship under the condition where the gas flow rate is low, i.e., equal to or lower than 1 m/sec, a difference between a desirable oxygen concentration profile of, for example, a high-concentration N-type monocrystal manufactured under a condition of a slow gas flow rate equal to or lower than 1 m/sec and the actual oxygen concentration profile can be reduced as compared to a conventional arrangement.

In the above arrangements, the following is preferable. The controlling the oxygen concentration of the monocrystal at the predetermined position in the pulling-up direction includes: controlling at least one of a pressure P and a flow volume V in a manner that a first oxygen concentration decrease amount $J_{SP}$ that corresponds to an evaporation amount, in accordance with the pressure in the chamber, of a semiconductor oxygen evaporant generated when an element of the semiconductor melt at the predetermined position of a non-dope monocrystal is bonded with oxygen, the amount $J_{SP}$ being calculated based on the following formula (1) becomes, becomes a predetermined value, a second oxygen concentration decrease amount $J_{DP}$ that corresponds to a evaporation amount, in accordance with the pressure in the chamber, of a dopant oxygen evaporant generated when the volatile dopant of the dopant-added melt at the predetermined position of the monocrystal is bonded with oxygen, the amount $J_{DP}$ being calculated based on the following formula (2), becomes a predetermined value, and a third oxygen concentration decrease amount $J_{DF}$ that corresponds to a evaporation amount, in accordance with the flow volume of the inactive gas, of the dopant oxygen evaporant at the predetermined position of the monocrystal, the amount $J_{DF}$ being calculated based on the following formula (3), becomes a predetermined value, where S1 indicates a first crucible function for which a contact area of the dopant-added melt contained in the crucible and the crucible is divided by an area of a free surface of the dopant-added melt, S2 indicates a second crucible function for which a contact area of the dopant-added melt contained in the crucible and the crucible is multiplied by the area of the free surface of the dopant-added melt, P indicates the pressure in the chamber, $Oi_{REF}$ indicates an oxygen concentration at the predetermined position of the non-dope monocrystal manufactured under a standard condition in which the semiconductor melt is contained in the crucible and a flow volume of the inactive gas and the pressure in the chamber are respectively set at predetermined standard values, N indicates a concentration of the volatile dopant in the dopant-added melt, V indicates the flow volume of the inactive gas introduced in the chamber when monocrystal is pulled from the dopant-added melt, and α, β, and γ are coefficients. Note that the standard conditions were employed as standards in the calculation of the first, second, and third oxygen decrease amounts $J_{SP}$, $J_{DP}$, and $J_{DF}$, for which the test condition 5 in the Table 2 mentioned below were employed.

$$J_{SP} = \alpha \times S1 \times P \times Oi_{REF} \quad (2)$$

$$J_{DP} = \beta \frac{N}{P \times S1} \quad (3)$$

$$J_{DF} = \gamma \frac{N}{\sqrt{V}} \times S2 \quad (4)$$

With this arrangement, the control of the oxygen concentration of the monocrystal includes controlling at least one of the inner pressure P and the gas flow rate V to make the first oxygen concentration decrease amount $J_{SP}$, the second oxygen concentration decrease amount $J_{DP}$, and the third oxygen concentration decrease amount $J_{DF}$ respectively calculated based on the above formulae (2), (3), and (4) take predetermined values.

After a dedicated study, the inventor(s) deduced the above Formulae (2), (3), and (4) as the first, second, and third decrease amount calculating formulae for calculating the first, second, and third oxygen concentration decrease amounts $J_{SP}$, $J_{DP}$, $J_{DF}$ (hereinafter referred to as the first, second, and third decrease amount calculating formulae (2), (3), and (4)) as follows.

Initially, an argon (Ar) gas was employed as an inactive gas, silicon was employed as an element for the semiconductor melt, an arsenic (As) was employed as a volatile dopant, and a form of evaporation of oxygen from the semiconductor melt and a form of evaporation of oxygen from a dopant-added melt generated by adding arsenic (volatile dopant) to the semiconductor melt were modeled. Then, it was found that the form of the evaporation of oxygen from the semiconductor melt could be modeled as the form of the evaporation of semiconductor oxygen evaporant ($Si_xO_y$) bonded with silicon of the semiconductor melt. In addition, it was found that the evaporation of oxygen from the dopant-added melt could be modeled as a evaporation of semiconductor oxygen evaporant and dopant oxygen evaporant (AsO) bonded with arsenic of the dopant-added melt.

Next, as shown in Table 1, non-dope monocrystals were manufactured under test conditions 1 to 3 where the inner pressure was fixed and the gas flow volume was changed. Then, the oxygen concentration profiles dependent only on the semiconductor oxygen evaporant were compared.

TABLE 1

| TEST CONDITIONS | 1 | 2 | 3 |
|---|---|---|---|
| GAS FLOW VOLUME (L/min) | 50 | 150 | 200 |
| INNER PRESSURE (Pa) | 59985 | 59985 | 59985 |

As a result, it was found that the oxygen concentration profiles under the test conditions 1 to 3 were substantially identical and that the evaporation amount of the semiconductor oxygen evaporant was not dependent on the argon gas flow volume.

Further next, as shown in Table 2, non-dope monocrystals were manufactured under test conditions 4 and 5 where the gas flow volume was fixed and the inner pressure was changed to compare the oxygen concentration profiles thereof.

TABLE 2

| TEST CONDITIONS | 4 | 5 |
|---|---|---|
| GAS GLOW VOLUME (L/min) | 50 | 50 |
| INNER PRESSURE (Pa) | 9997 | 59985 |

As a result, it was found that the oxygen concentration under the test condition 5 was greater than that under the test condition 4 and that the evaporating amount of the semiconductor oxygen evaporant was dependent on the inner pressure.

In addition, when the amounts of oxygen concentration decreases that correspond to the evaporating amounts of the semiconductor oxygen evaporant were observed for a plurality of predetermined pulling-up positions (e.g., every 100 mm) of non-dope monocrystals under the test conditions 4 and 5, it was found that the oxygen concentration decrease amount was gradually reduced toward a side (hereinafter referred to as the distal end side) opposite to the seed crystal of the non-dope monocrystal. In short, it was found that concentration of oxygen absorbed in the monocrystal varied depending on the predetermined pulling-up positions of the non-dope monocrystal. It is estimated that such a change occurred because of change in the oxygen supply and the oxygen evaporation.

Based on such an idea, a correlation was analyzed between: a contact area of the crucible and the semiconductor melt, the contact area being a factor dependent on the oxygen supply; and a surface area (hereinafter referred to as the free surface area) of a portion of the semiconductor melt not contacting with the crucible, the free surface area being a factor dependent on the oxygen evaporation.

Specifically, a multivariate analysis was conducted with oxygen concentration decrease, the inner pressure, the contact area, and the free surface area being set as independent variables. Then, the above-mentioned first decrease amount calculating formula (2) for calculating the first oxygen concentration decrease amount $J_{SP}$ corresponding to the evaporation amount of the semiconductor oxygen evaporant in accordance with the inner pressure at the predetermined pulling-up position was deduced.

Note that, in the first decrease amount calculating formula (2), $Oi_{REF}$ indicates an oxygen concentration of the test condition 5, S1 is a first crucible function obtained by dividing the contact area by the free surface area, and S2 is a second crucible function obtained by multiplying the contact surface by the free surface area.

Next, dependency of the evaporation of the dopant oxygen evaporant on the inner pressure was examined.

Initially, it was assumed that, similarly to the semiconductor oxygen evaporant, the evaporation amount of the dopant oxygen evaporant was dependent on: the contact area of the crucible and the dopant-added melt; and the free surface area of the dopant-added melt. Accordingly, a multivariate analysis was conducted with the oxygen concentration decrease amount, the inner pressure, the dopant concentration in the melt, the contact area, and the free surface area being set as the independent variables to find a relationship of the highest correlation. Then, the above-mentioned second decrease amount calculating formula (3) for calculating the second oxygen concentration decrease amount $J_{DP}$ corresponding to the evaporation amount of the dopant-added melt in accordance with the inner pressure at the predetermined pulling-up position was deduced. Note that, because the dopant concentration N of the melt changes as time elapses or the pulling-up of the crystal progresses, as shown in FIG. 3, the entire evaporation amount was calculated based on a speed J of dopant evaporation per unit time and unit area calculated based on the following formula (5), a surface area of the dopant-added melt, and the time. Subsequently, the entire dopant amount in the melt after the unit time was calculated based on a volume of the dopant-added melt in view of the crystal having grown in the unit time and on a rise in the dopant concentration N in the melt caused by segregation, from which the entire evaporation amount was subtracted to obtain the dopant concentration N in the melt after the unit time.

$$J = \alpha \sqrt{X} \, e^{(\beta N/\sqrt{T})} \tag{5}$$

In addition, in view of the above-mentioned modeling of the form of oxygen evaporation, influence on the oxygen evaporation relative by the gas flow volume was examined in the same manner as the second decrease amount calculating formula (3) was deduced. In other words, a multivariate analysis was conducted with the oxygen concentration decrease amount, the inactive gas flow volume, the dopant concentration in the melt, the contact area, and the free surface area to deduce a relation having the highest correlation being set as the independent variables. Then, the above-mentioned third decrease amount calculating formula (4) for calculating the third oxygen concentration decrease amount $J_{DF}$ corresponding to the evaporation amount of the dopant-added melt in accordance with the gas flow volume at the predetermined pulling-up position.

Accordingly, the oxygen concentration of the predetermined pulling-up position can be more precisely controlled by controlling the inner pressure P and the gas flow volume V in such a manner that the first, second, and third oxygen concentration decrease amount $J_{SP}$, $J_{DP}$, and $J_{DF}$ calculated based on the first, second, and third decrease amount calculating formulae (2), (3), and (4) take predetermined values. Therefore, the difference between the desirable oxygen concentration profile and the actual oxygen concentration profile can be reduced as compared to the conventional arrangement.

BEST MODE FOR CARRYING OUT THE INVENTION

An embodiment of the invention will be described below with reference to the drawings.

Figure 1:
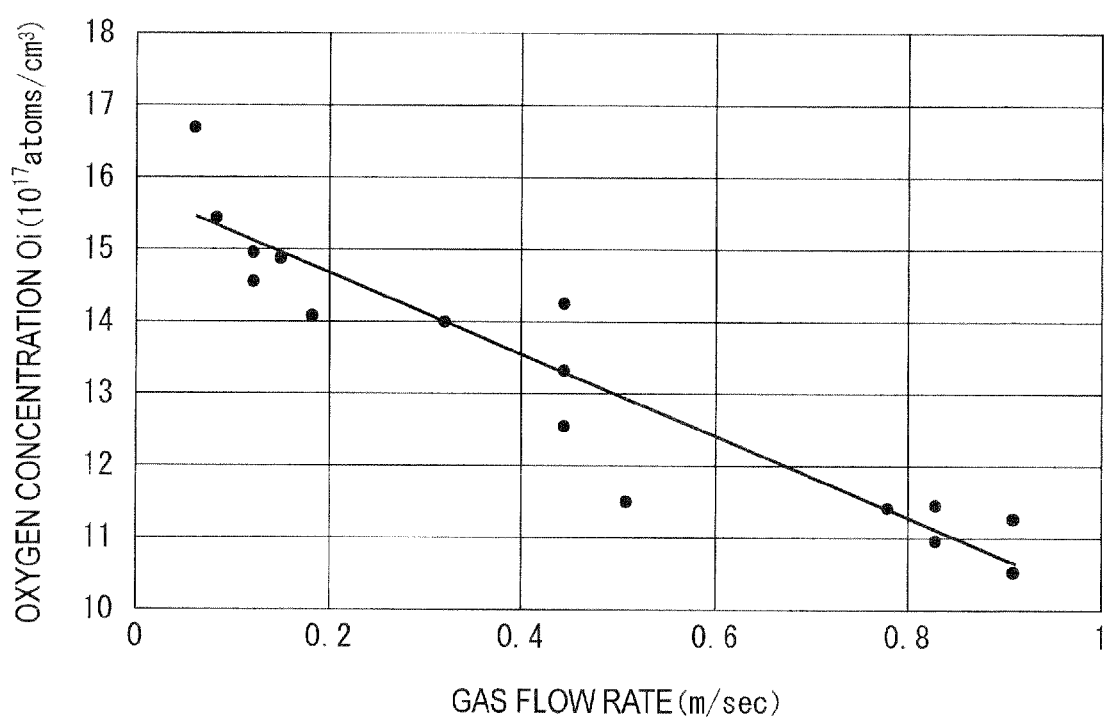
FIG. 1 is a graph showing a relationship between an inactive gas flow rate and an oxygen concentration at a position on a straight body of a monocrystal where a distance in a pulling-up direction from an end is 200 mm in an experiment conducted to derive first, second, and third decrease amount calculating formulae according to the invention.
Figure 2:
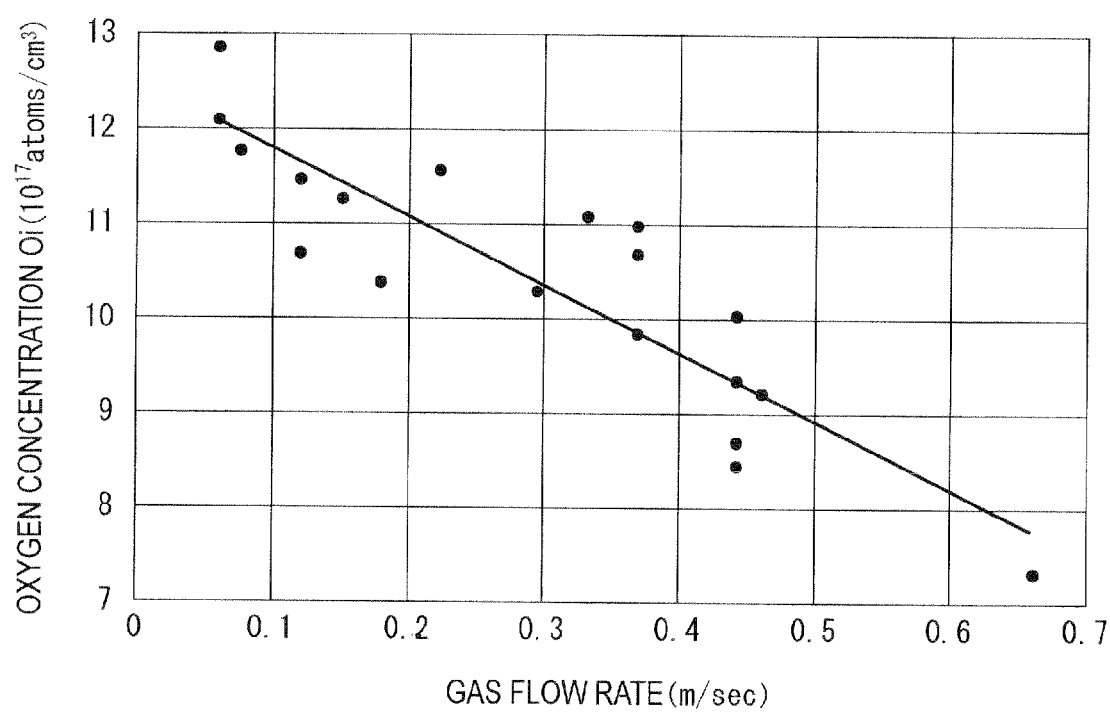
FIG. 2 is a graph showing a relationship between an inactive gas flow rate and an oxygen concentration at a position on a straight body of a monocrystal where a distance in a pulling-up direction from an end is 500 mm in an experiment conducted to derive the first, second, and third decrease amount calculating formulae.
Figure 3:
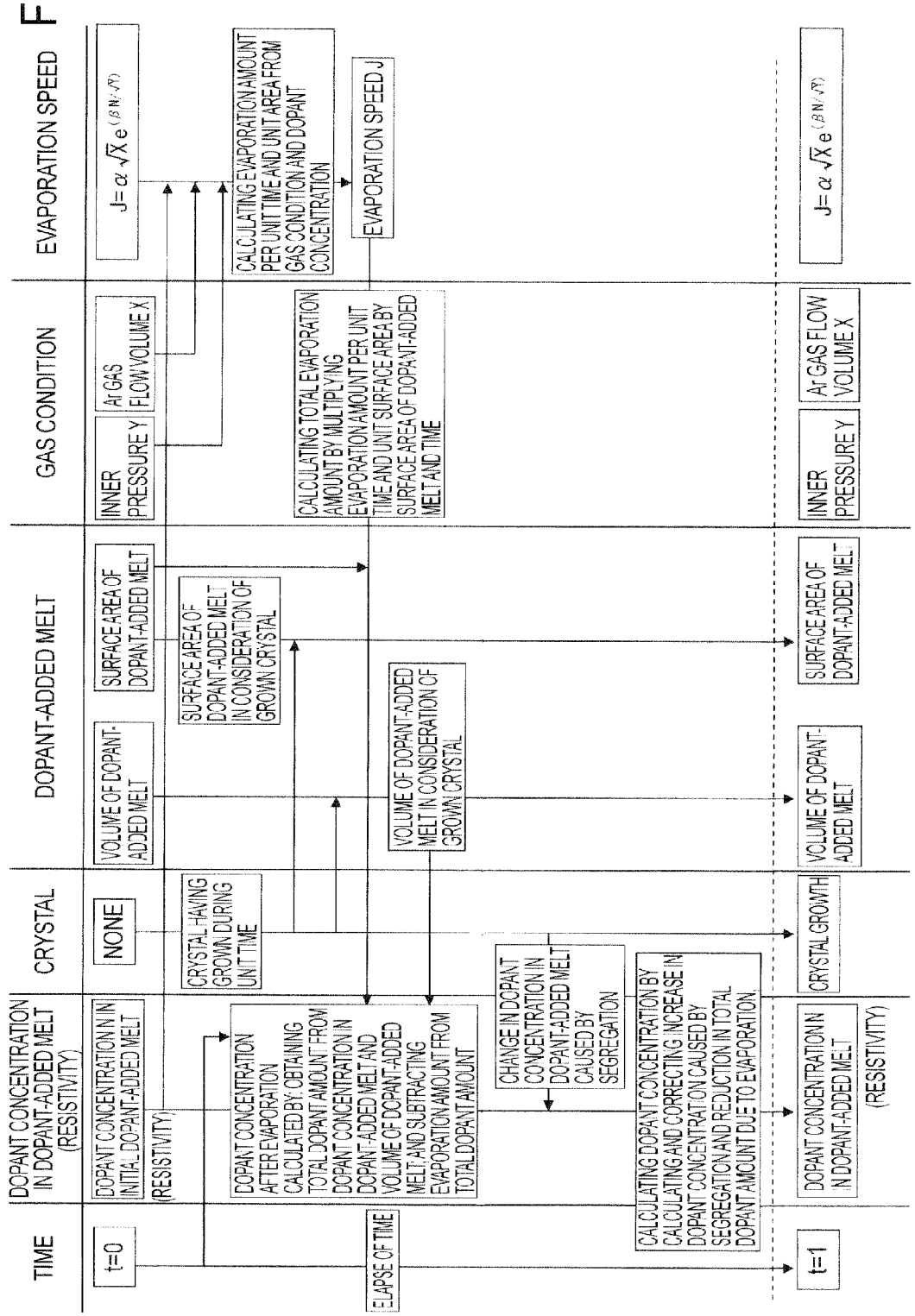
FIG. 3 is a flow diagram showing an example of manufacturing method of a monocrystal employed for calculating a concentration of a volatile dopant.
Figure 4:
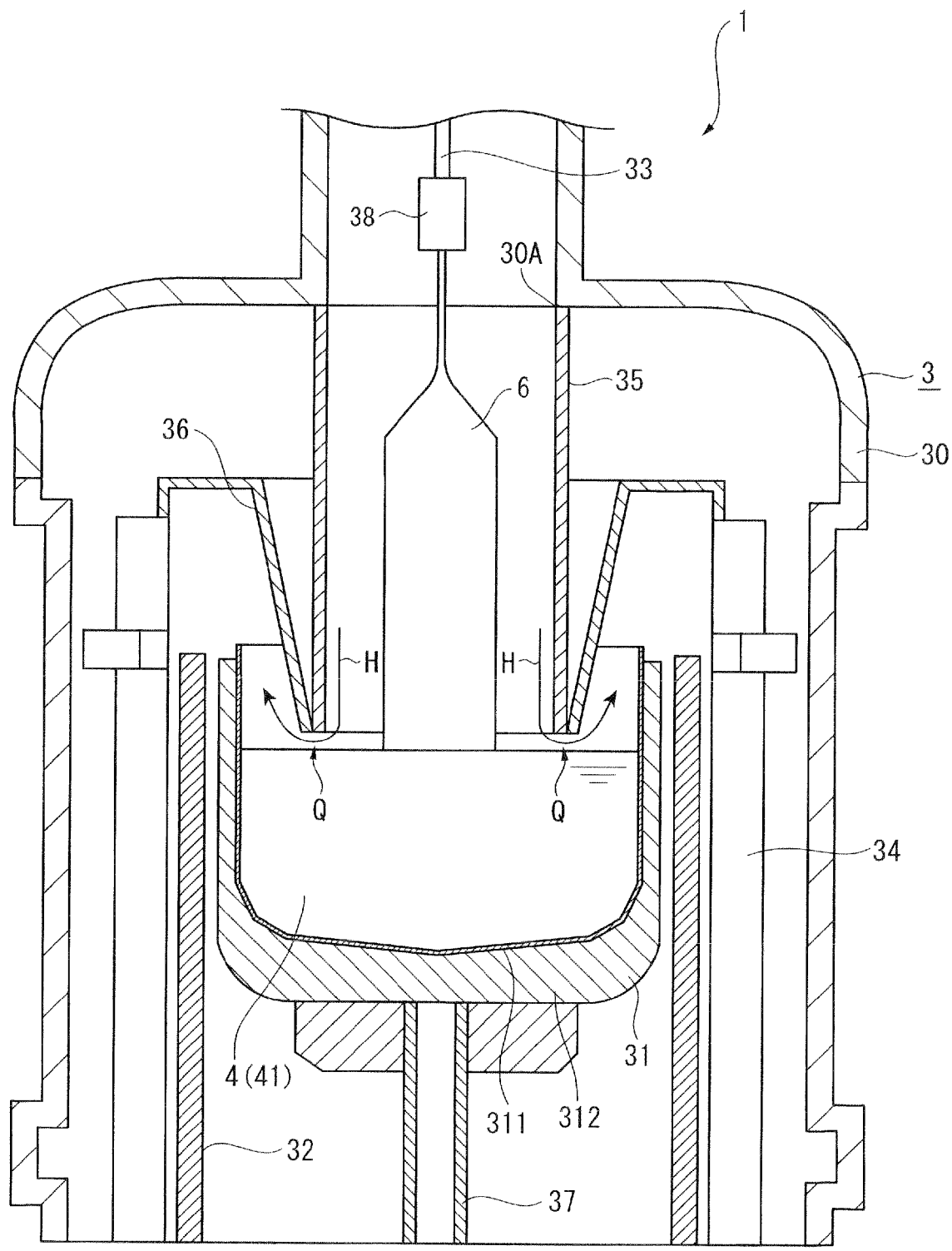
FIG. 4 is a schematic view showing a simplified arrangement of a pulling-up apparatus according to an embodiment of the invention.

FIG. 4 is a schematic view of a pulling-up apparatus used to manufacture a monocrystal according to the embodiment.
Arrangement of Pulling Device Initially, an arrangement of a pulling-up apparatus will be described.

As shown in FIG. 4, a pulling-up apparatus 1 includes a pulling-up apparatus body 3, a doping device (not shown), and a controller (not shown).

The pulling-up apparatus body 3 includes: a chamber 30; a crucible 31 disposed in the chamber 30; a heater 32 that heats the crucible 31 by radiating heat; a pulling-up portion 33; a heat insulating cylinder 34; a flow regulating cylinder 35 as a flow regulator; and a shield 36 as a flow regulator.

Under control of the controller, a predetermined flow volume of inactive gas, e.g., argon gas, is introduced in the chamber 30 downwardly from an upper side via an intake 30A provided at an upper portion. Pressure in the chamber 30 (i.e., inner pressure) is controllable by the controller.

The crucible 31 melts polycrystal silicon, from which a semiconductor wafer is made, to yield a silicon semiconductor melt 4. The crucible 31 includes: a first crucible 311 made of quartz and shaped in a cylinder having a bottom; and a second crucible 312 made of graphite and disposed at an outside of the first crucible 311 to house the first crucible 311. The crucible 31 is supported by a support shaft 37 that rotates at a predetermined speed.

The heater 32 is disposed at the outside of the crucible 31 and heats the crucible 31 to melt silicon in the crucible 31.

The pulling-up portion 33 is disposed at an upper side of the crucible, and a seed holder 38 for holding a seed crystal (not shown) or a doping device is suitably attached to the pulling-up portion 33. The pulling-up portion 33 is rotatable and elevates at a predetermined pulling-up speed under control of the controller.

The heat insulating cylinder 34 is disposed to surround the crucible 31 and the heater 32.

The flow regulating cylinder 35 is for regulating flow of inactive gas introduced from the upper side of the chamber 30. The flow regulating cylinder 35 is shaped in a cylinder and surround the monocrystal 6 pulled by the pulling-up portion 33 from the intake 30A of the chamber 30 to the vicinity of a surface of the semiconductor melt 4.

The shield 36 is a heat shield for shielding radiation heat radiated upward from the heater 32. The shield 36 surrounds a portion of the flow regulating cylinder 35 lower than a substantially central portion in the up-down direction and covers the surface of the semiconductor melt 4. The shield 36 is shaped in a cone in which a lower opening is smaller than an upper opening.

The doping device volatilizes a volatile dopant in a solid state and dopes (i.e., adds) the dopant to the semiconductor melt 4 in the crucible 31. Examples of the volatile dopant include red phosphorus, arsenic, and antimony. Incidentally, the doping device may be arranged to add the volatile dopant to the semiconductor melt 4 by soaking a lower portion of the cylindrical portion thereof in the semiconductor melt 4 or be arranged to add the volatile dopant to the semiconductor melt 4 by spacing the lower portion of the cylindrical portion from the semiconductor melt 4 and by blowing the volatilized volatile dopant to the semiconductor melt 4.

Based on settings inputted by an operator, the controller suitably controls the gas volume in the chamber 30, the inner pressure in the chamber 30, and the pulling-up speed of the pulling-up portion 33 to control the manufacture of the monocrystal 6.
Method for Producing Monocrystal Next, a method for manufacturing the monocrystal 6 with the pulling-up apparatus 1 will be described.

Initially, the operator attaches the doping device to the pulling-up portion 33 of the pulling-up apparatus 1.

Next, under control of the controller, the pulling-up apparatus 1 sets the gas volume and the inner pressure in the chamber 30 in a predetermined condition and generates the dopant-added melt 41 by adding the volatile dopant to the semiconductor melt 4.

Subsequently, the operator removes the doping device from the pulling-up portion 33 and attaches the seed holder 38 holding a seed crystal to the pulling-up portion 33.

Then, based on the settings inputted by the operator, the controller of the pulling-up apparatus 1 pulls the seed crystal at a predetermined speed to manufactured the monocrystal 6.

When the seed crystal is pulled, an oxygen concentration at a predetermined pulling-up position is controlled based on a relationship as the flow rate of inactive gas at a surface top position Q (defined below) is increased, the oxygen concentration of the monocrystal 6 is decreased under a condition as follows: the gas volume V of the inactive gas in the chamber 30 being in the range of 40 L/min to 400 L/min and the inner pressure P in the chamber 30 being in the range of 5332 Pa to 79980 Pa. In other words, the flow rate of the inactive gas at a position between the lower end of the flow regulating cylinder 35 and the surface of the dopant-added melt 41 in the crucible 31, i.e., the surface top position Q directly above the free surface of the dopant-added melt 41, is set to be rather slow. Note that an arrow H in FIG. 4 indicates a flow direction of the inactive gas.

More specifically, the oxygen concentration is controlled as follows. First, second and third concentration decrease amounts $J_{SP}$, $J_{DP}$, and $J_{DF}$ calculated based on first, second, and third decrease amount calculating formulae (6), (7), and (8) are assigned in the following formula (9) (hereinafter referred to as the oxygen concentration formula (9)) to obtain a calculated oxygen concentration Oi. The inner pressure P and the gas flow volume V at the predetermined pulling-up position are controlled to set Oi at a predetermined value. In short, the inner pressure P and the gas flow volume V are controlled to set the first, second, and third oxygen concentration decrease amounts $J_{SP}$, $J_{DP}$, and $J_{DF}$ at predetermined values.

Here, in the first, second, and third decrease amount calculating formulae (6), (7), and (8), S1 represents a first crucible function for which the contact area of the crucible 31 and the dopant-added melt 41 is divided by the free surface area of the dopant-added melt 41. S2 represents a second crucible function for which the contact area of the crucible 31 and the dopant-added melt 41 is multiplied by the free surface area of the dopant-added melt 41. $Oi_{REF}$ represents an oxygen concentration at a predetermined pulling-up position of a non-dope monocrystal manufactured with the semiconductor melt 4 being contained in the crucible 31 and the gas flow volume of the inactive gas and the inner pressure being set in a standard condition. N represents a concentration of the volatile dopant in the dopant-added melt 41. α, β, and γ represent coefficients.

$$J_{SP} = \alpha \times S1 \times P \times Oi_{REF} \quad (6)$$

$$J_{DP} = \beta \frac{N}{P \times S1} \quad (7)$$

$$J_{DF} = \gamma \frac{N}{\sqrt{V}} \times S2 \quad (8)$$

$$Oi = J_{SP} - J_{DP} - J_{DF} \quad (9)$$

Advantages of Embodiment

As set forth above, the following advantages can be obtained according to the embodiment.

(1) An oxygen concentration of the monocrystal 6 at a predetermined pulling-up position is controlled based on a relationship the oxygen concentration of the monocrystal 6 is decreased as the flow rate of inactive gas at a surface top position Q is increased when the monocrystal 6 is manufactured with the pulling-up apparatus 1 under a condition of the gas volume V in the chamber 30 being in the range of 40 L/min to 400 L/min and the inner pressure P being in the range of 5332 Pa to 79980 Pa.

Accordingly, based on the above-mentioned relationship, the oxygen concentration of the monocrystal 6 is suitably controlled to be elevated to manufactured the monocrystal 6 having a desirable oxygen concentration.

In addition, because the oxygen concentration is controlled under a condition corresponding to a condition where the gas flow rate is rather slow, the difference between a desirable oxygen concentration profile of a monocrystal manufactured under a condition where the gas flow rate is rather slow and an actual oxygen concentration profile can be reduced as compared to a conventional arrangement.

In addition, because the gas flow rate at the surface top position Q is employed as a factor for controlling the oxygen concentration, the oxygen concentration can be controlled in consideration of influence on melt convection (i.e., convection at the surface top position Q) by the amount of oxygen evaporation and by the gas flow rate.

Therefore, the oxygen concentration of the monocrystal 6 can be appropriately controlled.

(2) The oxygen concentration is controlled by controlling the inner pressure P and the gas flow volume V at the predetermined pulling-up position in such a manner that the calculated oxygen concentration Oi calculated based on the above-mentioned oxygen concentration formula (9) takes a predetermined value. In other words, the inner pressure P and the gas flow volume V are controlled so that the first, second, and third oxygen concentration decrease amounts $J_{SP}$, $J_{DP}$, and $J_{DF}$ calculated based on first, second, and third decrease amount calculating formulae (6), (7), and (8) are set to take predetermined values.

Accordingly, the oxygen concentration at the predetermined pulling-up position can be more precisely controlled by controlling the inner pressure P and the gas flow volume V in such a manner that the calculated oxygen concentration Oi takes a desirable value, based on the first, second, and third decrease amount calculating formulae (6), (7), and (8) and the oxygen concentration formula (9). Thus, the difference between the desirable oxygen concentration profile and the actual oxygen concentration profile can be reduced as compared to a conventional arrangement.

Another Embodiment

Note that the scope of the invention is not limited to the above embodiment, but improvements and design modifications may be made within the scope of the inventive concepts of the invention.

In the above embodiment, an arrangement in which the oxygen concentration is controlled based on the first, second and third decrease amount calculating formulae (6), (7), and (8) is described as an example of control of the oxygen concentration based on a relationship in which the oxygen concentration of the monocrystal 6 decreases as the inactive gas flow rate at the surface top position Q increases. However, the oxygen concentration may be controlled without being based on the formulae.

In addition, when the calculated oxygen concentration Oi is controlled to take a desirable value, only the inner pressure P or only the gas flow volume V may be controlled.

Figure 5:
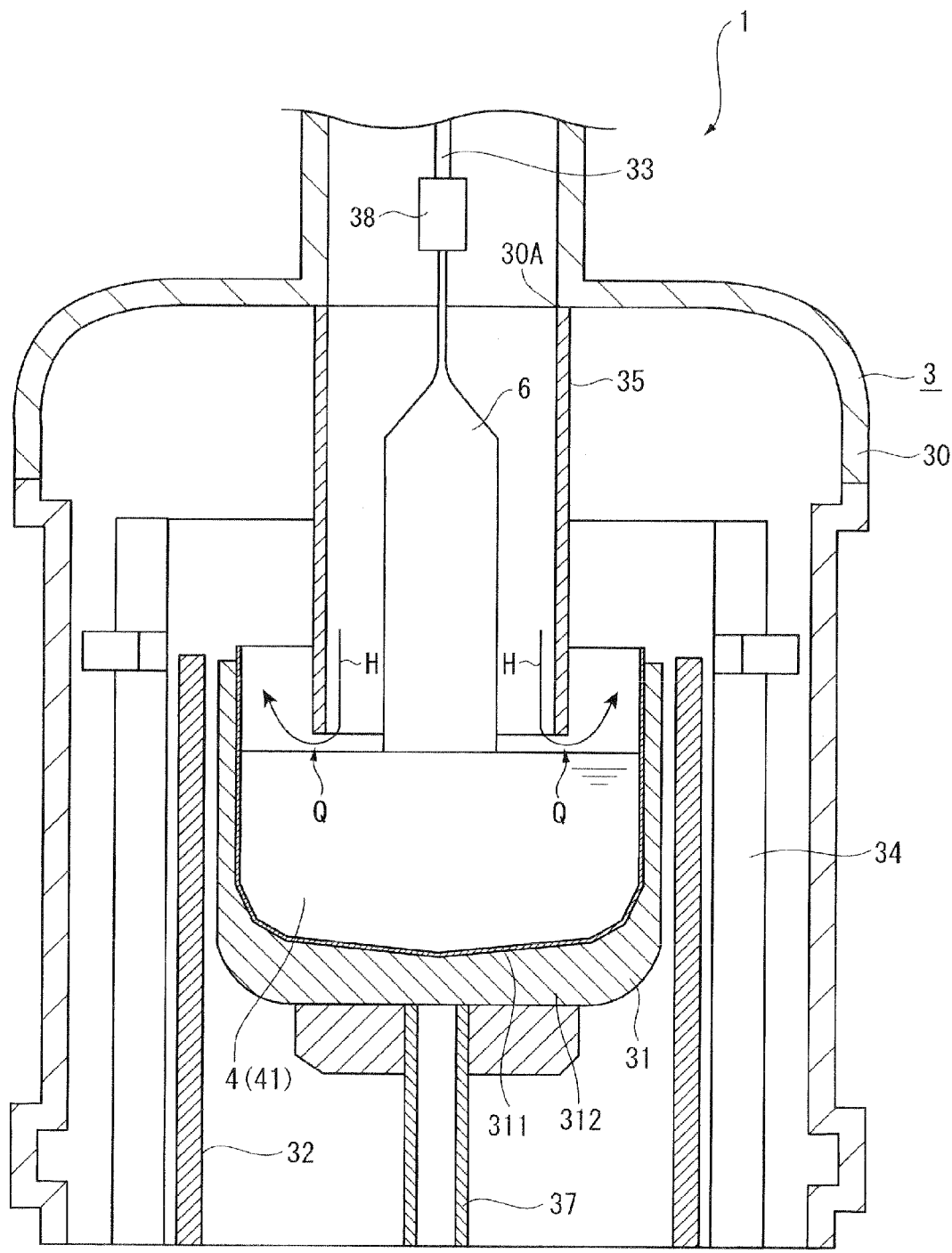
FIG. 5 is a schematic view showing a simplified arrangement of a pulling-up apparatus according to another embodiment of the invention.
Figure 6:
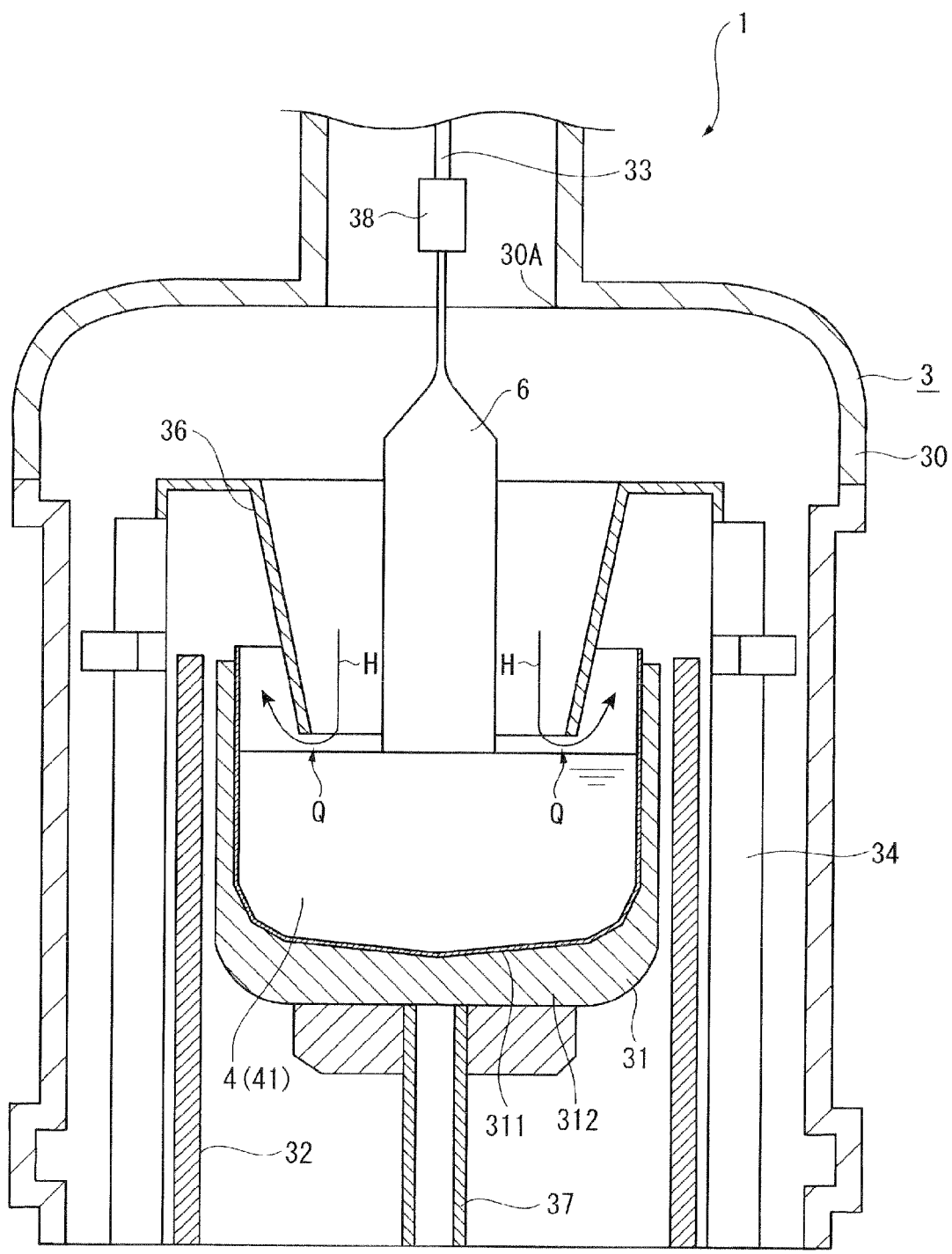
FIG. 6 is a schematic view showing a simplified arrangement of a pulling-up apparatus according to still another embodiment of the invention.

In addition, the control according to the invention as set forth above may be applied to a pulling-up apparatus 1 without the shield 36 as shown in FIG. 5 or a pulling-up apparatus 1 without the flow regulating cylinder 35 as shown in FIG. 6.

EXAMPLE

Next, a relationship of an oxygen concentration of a monocrystal calculated based on the oxygen concentration formula (9); an oxygen concentration of a monocrystal manufactured under a control based on the oxygen concentration formula (9); and an oxygen concentration of a monocrystal manufactured tinder a conventional control not based on the oxygen concentration formula (9) will be described.

Method of Experiment

A monocrystal was manufactured using a pulling-up apparatus similar to the pulling-up apparatus 1 of the above embodiment under a control based on the oxygen concentration formula (9) (hereinafter referred to as improvement control) for adapting the oxygen concentration to a product standard. When the monocrystal was manufactured, as shown in FIG. 7, an argon gas flow rate under a condition where the argon gas flow volume was in the range of 40 L/min to 400 L/min and the inner pressure was in the range of 5332 Pa and 79980 Pa was applied.

Note that a position where the solidification rate is 0.0 corresponds to a crystal base end and a position where the solidification rate is 1.0 corresponds to a total amount of the raw polycrystal silicon thrown into the crucible at an early stage.

Figure 7:
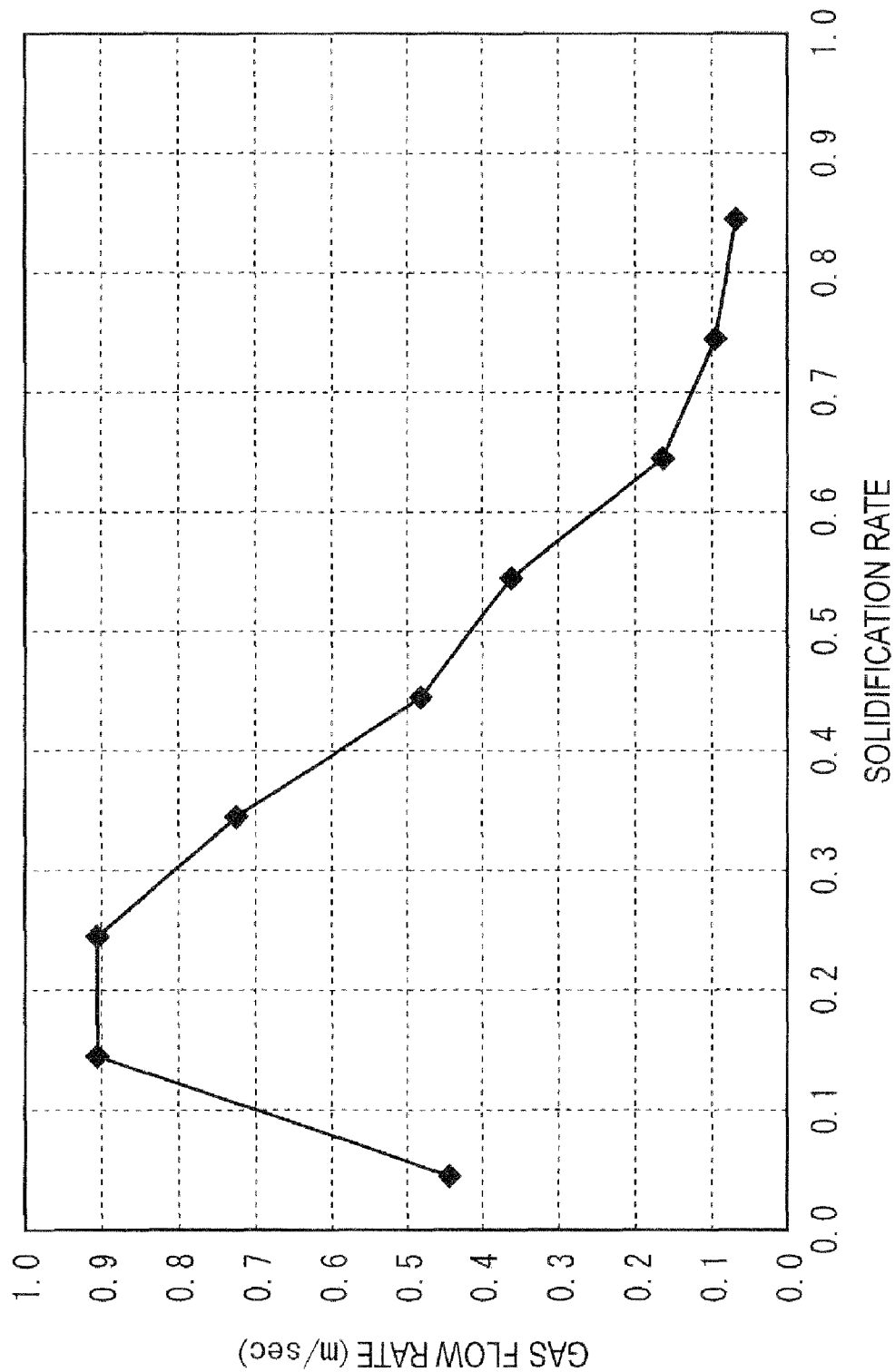
FIG. 7 is a graph showing a flow rate condition of argon gas in Example of the invention.

According to the condition shown in FIG. 7, the gas flow rate at a surface top position decreases from a position where the solidification rate takes approximately 0.25 toward a distal end of the crystal.

The oxygen concentration of a monocrystal manufactured with the improvement control was measured in a pulling-up direction as an improvement actually-measured profile.

In addition, the argon gas flow volume and the inner pressure that provide the argon gas flow rate of FIG. 7 were assigned into the first, second, and third decrease amount calculating formulae (6), (7), and (8) and the oxygen concentration formula (9) to obtain an oxygen concentration, which was employed for calculation as a improvement calculated profile.

In addition, although detailed conditions are not described here, a conventional control not based on the oxygen concentration formula (9) (hereinafter referred to as the conventional control) was employed for controlling the oxygen concentration to match the product standards and then the monocrystal was manufactured. Then, the oxygen concentration of the monocrystal manufactured with the conventional control was measured as a conventional actually-measured profile.

Result of Experiment

Figure 8:
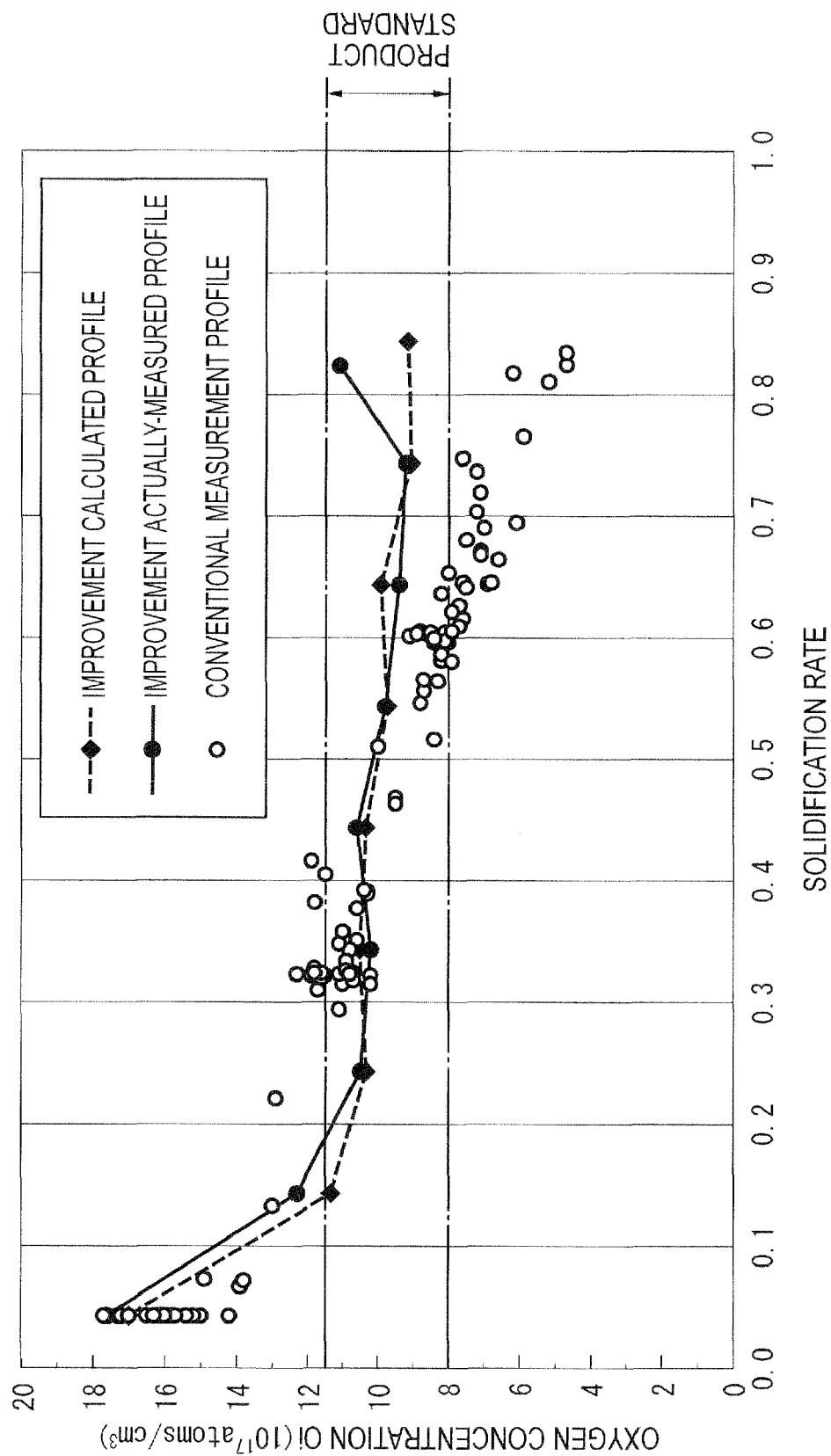
FIG. 8 is a graph showing a relationship of an oxygen concentration of a monocrystal calculated based on the oxygen concentration formula in the above-mentioned Example, an oxygen concentration of a monocrystal manufactured under a control based on the oxygen concentration formula, and an oxygen concentration of a monocrystal manufactured with a conventional control.

As shown in FIG. 8, it was observed that the monocrystal with the improvement control exhibited lower oxygen concentration Oi than that of the conventional control from the position where the solidification rate was approximately 0.15 to the position where the solidification rate was approximately 0.4, and exhibited higher oxygen concentration Oi than that of the conventional control from the position where the solidification rate was approximately 0.5 to a distal end of the crystal. In addition, the oxygen concentration Oi with the improvement control was observed to be matching the product standard from the position where the solidification rate was approximately 0.25 to the distal end of the crystal.

One of the presumable reasons is that, with the improvement control, the gas flow rate was controlled to be gradually higher towards the position where the solidification rate was approximately 0.4 from the position where the solidification rate was approximately 0.15, and the gas flow rate was controlled to be gradually lower toward the distal end of the crystal from the position where the solidification rate was approximately 0.5. Accordingly, it is considered that the oxygen concentration Oi on the side of the base end of the crystal could made lower than that of the conventional control, and the oxygen concentration Oi on the side of the distal end of the crystal could be made higher than that of the conventional control.

Thus, it has been found that a difference between a desirable oxygen concentration profile (profile according to the product standard) and the improvement actually-measured profile can be reduced as compared to the conventional actually-measured profile by controlling the oxygen concentration Oi based on the relationship in which the oxygen concentration Oi of a singe crystal decreases as the inactive gas flow rate at the surface top position increases when a monocrystal is manufactured under a condition where the gas flow volume is in the range of the 40 L/min to 400 L/min and the inner pressure is in the range of 5332 Pa to 79980 Pa.

In addition, the improvement actually-measured profile and the improvement calculated profile were found to be substantially equal all along the pulling-up direction of the monocrystal.

Thus, it has been found from the above that the oxygen concentration Oi can be more precisely controlled and the difference between the desirable oxygen profile and the improvement actually-measured profile can be reduced as compared to the conventional actually-measured profile by controlling the inner pressure P and the gas flow volume V in such a manner that the first, second, and third oxygen decrease amounts $J_{SP}$, $J_{DP}$, and $J_{DF}$ calculated based on the first, second, and third decrease amount calculating formulae (6), (7), and (8) take predetermined values.

The invention claimed is:

1. A method for manufacturing a monocrystal, the method comprising:

using a pulling-up apparatus including: (i) a chamber having, at an upper portion thereof, an intake through which an inactive gas is introduced, (ii) a crucible disposed in the chamber and adapted to contain a dopant-added melt generated by adding a volatile dopant to a silicon semiconductor melt, (iii) a flow regulating member which is shaped in one of a cylinder and a reversed truncated cone, having openings at upper and lower ends, and which is disposed at an upper side of the crucible, (iv) a pulling-up portion that, for manufacture of the monocrystal, pulls up a seed crystal so that the seed crystal passes through an inside of the flow regulating member after the seed crystal is contacted with the dopant-added melt; and controlling an oxygen concentration of the monocrystal at a predetermined position in a pulling-up direction by controlling a flow volume of the inactive gas introduced in the chamber to be in a range of 40 L/min to 400 L/min and a pressure in the chamber to be in a range of 5332 Pa to 79980 Pa, wherein in the controlling the oxygen concentration, at least one of a pressure P in the chamber and a flow volume V of the inactive gas introduced in the chamber when the monocrystal is pulled from the dopant-added melt is controlled in such a manner that an oxygen concentration Oi becomes a predetermined value, the oxygen concentration Oi being obtained according to the following formula (4):

$$Oi = J_{SP} - J_{DP} - J_{DF} \quad (4)$$

where $J_{SP}$, is a first oxygen concentration decrease amount that corresponds to an evaporation amount, in accordance with the pressure in the chamber, of a semiconductor oxygen evaporant generated when an element of the semiconductor melt at the predetermined position of a non-doped monocrystal is bonded with oxygen, and is calculated based on the following formula (1):

$$J_{SP} = \alpha \times S1 \times P \times Oi_{REF} \quad (1)$$

where $J_{DP}$ is a second oxygen concentration decrease amount that corresponds to an evaporation amount, in accordance with the pressure in the chamber, of a dopant oxygen evaporant generated when the volatile dopant of the dopant-added melt at the predetermined position of the monocrystal is bonded with oxygen, and is calculated based on the following formula (2):

$$J_{DP} = \beta \frac{N}{P \times S1} \quad (2)$$

where $J_{DF}$ is a third oxygen concentration decrease amount that corresponds to an evaporation, in accordance with the flow volume of the inactive gas, of the dopant oxygen evaporant at the predetermined position of the monocrystal, and is calculated based on the following formula (3):

$$J_{DF} = \gamma \frac{N}{\sqrt{V}} \times S2 \tag{3}$$

where S1 indicates a first crucible function for which a contact area of the dopant-added melt contained in the crucible and the crucible is divided by an area of a free surface of the dopant-added melt, S2 indicates a second crucible function for which a contact area of the dopant-added melt contained in the crucible and the crucible is multiplied by the area of the free surface of the dopant-added melt, $Oi_{REF}$ indicates an oxygen concentration at the predetermined position of the non-doped monocrystal manufactured under a standard condition in which the semiconductor melt is contained in the crucible and a flow volume of the inactive gas and the pressure in the chamber are respectively set at predetermined standard values, N indicates a concentration of the volatile dopant in the dopant-added melt, and $\alpha$, $\beta$, and $\gamma$ are coefficients.

* * * * *